(12) United States Patent
Jacobs

(10) Patent No.: US 6,259,551 B1
(45) Date of Patent: Jul. 10, 2001

(54) PASSIVATION FOR MICROMECHANICAL DEVICES

(75) Inventor: Simon Joshua Jacobs, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/408,094

(22) Filed: Sep. 27, 1999

Related U.S. Application Data

(60) Provisional application No. 60/102,521, filed on Sep. 30, 1998.

(51) Int. Cl.$^7$ ..................................................... G02B 26/08

(52) U.S. Cl. ...................... 359/298; 359/291; 359/296; 257/682; 427/162

(58) Field of Search .................................. 359/298, 291, 359/290, 295, 296; 257/682; 427/162, 255.6

(56) References Cited

U.S. PATENT DOCUMENTS

| 4,957,993 | * | 9/1990 | Lee ........................................... 528/26 |
| 5,331,454 | | 7/1994 | Hornbeck ............................... 359/224 |
| 5,411,769 | | 5/1995 | Hornbeck ............................... 427/534 |
| 5,602,671 | | 2/1997 | Hornbeck ............................... 359/224 |
| 5,610,438 | * | 3/1997 | Wallace et al. ....................... 257/682 |

* cited by examiner

Primary Examiner—Georgia Epps
Assistant Examiner—Tim Thompson
(74) Attorney, Agent, or Firm—Charles A. Brill; Wade James Brady, III; Frederick J. Telecky, Jr.

(57) ABSTRACT

A non-volatile passivation coating for micromechanical devices. The device has at least one surface (10) that contacts other surfaces and requires passivation. The passivation is provided by a monolayer of molecules (16) that has cross links (18) between the monolayers, or is of an highly stable material. The monolayer is applied by vacuum vapor coating, melt coating or coating from solution. The non-volatility of the monolayer eliminates the need for a hermetic package.

17 Claims, 1 Drawing Sheet

PASSIVATION FOR MICROMECHANICAL DEVICES

This application claims priority under 35 U.S.C. § 119 (e)(1) of provisional application No. 60/102,521 filed Sep. 30, 1998.

BACKGROUND OF THE INVENTION

1. Field of the Invention

This invention relates to protective coatings for microelectronic devices, more particularly to protective layers comprised of a monolayer.

2. Background of the Invention

Micromechanical devices typically comprise a device with moving parts manufactured with a size on the order of microns. Examples include gears, motors, moving mirrors and accelerometers. These moving parts sometimes come into contact with each other or with non-moving parts of the superstructure of the device.

Several techniques of lubrication and passivation are used to alleviate friction at these points of contact. The contact can cause physical damage to the parts, as well as sticking between the parts, preventing the devices from functioning as they are intended. Certain types of these devices, that contact other parts millions of times, have a problem with the lubricant or passivant desorbing from the surface. This leaves the surface unprotected and leads to damage.

Certain types of micromechanical devices are packaged with a passivant or lubricant contained in a hermetic package. The package must be hermetically sealed to prevent desorbed passivants from escaping the package. This allows the desorbed passivant to be replenished from within the package. These types of packages are expensive and require more complicated manufacturing processes.

Even without the package, however, the passivants or lubricants used in current practice desorb from the surfaces. A more stable passivant or lubricant is needed, preferably one that does not require a hermetic package.

SUMMARY OF THE INVENTION

One aspect of the invention is a passivation layer for a micromechanical device. The passivation layer is a monolayer of a material that is either capable of chemical cross-linking or extremely stable. Cross-linking makes the layer more stable and the passivant will not desorb from the surfaces being passivated.

Another aspect of the invention is that the use of a cross-linked or stable monolayer eliminates the need for a hermetically sealed package. Since the monolayer does not desorb from the surfaces, no containment is necessary, nor is there any need for replenishment.

It is an advantage of the invention in that the monolayer provides better protection for the surfaces of micromechanical devices.

It is a further advantage of the invention in that it eliminates the need for a hermetically sealed package, thereby reducing the complexity and cost of manufacturing.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE PREFERRED EMBODIMENTS

Micromechanical devices such as gears, motors and moving mirrors currently use various types of lubricants and passivants to overcome problems with stiction (sticking and friction). One example of these types of passivants is a monolayer, a layer of material that is one molecule thick.

Figure 1:
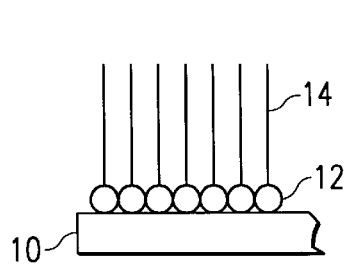
FIG. 1 shows a prior art embodiment of a monolayer.

An example of a monolayer used in these types of devices is described in U.S. Pat. No. 5,331,454, commonly owned by Texas Instruments and incorporated by reference herein. The monolayer, as shown in FIG. 1, was a perfluorinated carboxylic acid called perfluorodecanoic acid (PFDA), which is volatile. The device in FIG. 1 comprises a surface 10 of either a moving part, or a surface that comes into contact with a moving part.

The monolayer is comprised of the end group of the PFDA molecules 12. PFDA here is used as an example of the prior art. Any type of monolayer that does not have cross-linking is an example of the prior art. The molecules 12 do not have cross-linking of their tails 14, as shown in FIG. 1.

Figure 2A:
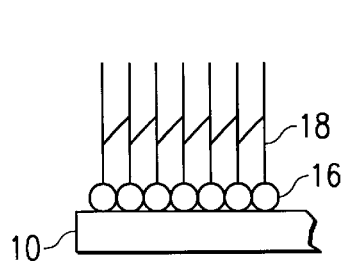
FIGS. 2a and 2b show examples of monolayers in accordance with the invention.

A monolayer that has cross-linking of the tails is shown in FIG. 2a in accordance with the invention. The end molecules 16 have tails 18 that are chemically cross-linked with neighboring molecules. This capability makes the monolayer far more stable and less likely to desorb.

Figure 2B:
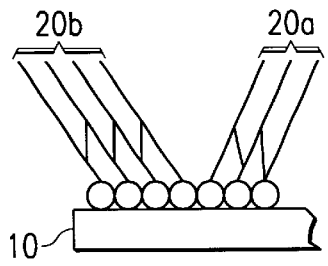

FIG. 2b shows an example of how cross-linked molecules can be cross-linked within groups called domains. In FIG. 2b, two distinct domains are shown 20a and 20b. Each domain is cross-linked within itself, but not to each other. In general, these types of layers act similarly to the layer shown in FIG. 2a.

Several types of materials have this characteristic, including vinyl, alkoxysilyl, ethynyl, diethynyl, and hydrogen bonding groups, such as an amide. A particularly useful molecular structure for cross-linking would be:

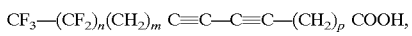

$CF_3-(CF_2)_n(CH_2)_m C\equiv C-C\equiv C-(CH_2)_p COOH,$ where $0 \leq n, m, p \leq 10$.

Other useful materials include $CF_3-(CF_2)_n(CH_2)_m-Si(OR)_3$, where $0 \leq n, m \leq 10$, and R is a straight chain alkyl. In this example, the siloxane is responsible for attachment and cross-linking of the fluoro/hydrocarbon chain.

In addition to the materials that have the cross-linking capability, there are also highly stable materials that can be used, such as:

$CF_3(CF_2)_n(CH_2)_m COOH$; where $n \geq 7$ and $m \geq 10$. Any of these above materials could be applied by melt coating, vacuum vapor coating or coating from solution in an appropriate solvent.

Included in the group of stable materials are structures such as:

$CF_3(CF_2)_m$-Linker-$(CH_2)_n COOH$, where the linker material is any non-branched organic chain, such as ethers, sulfides, etc.

The use of these types of materials has several advantages for device protection as discussed above. Both the cross-linked and very stable structures have an advantage in their non-volatile nature. Since they are non-volatile, the materials need not be replenished. Replenishment of volatile materials in the micromechanical device area is typically handled by packaging the device in a hermetically sealed package, with extra passivant in the package with the device. As the device functions, the reserve of passivant heats up and deposits itself on areas of the device that need passivation.

The use of a hermetically sealed package adds complexity to the application and packaging steps of manufacturing these devices. This in turn increases costs of the devices.

Figure 3:
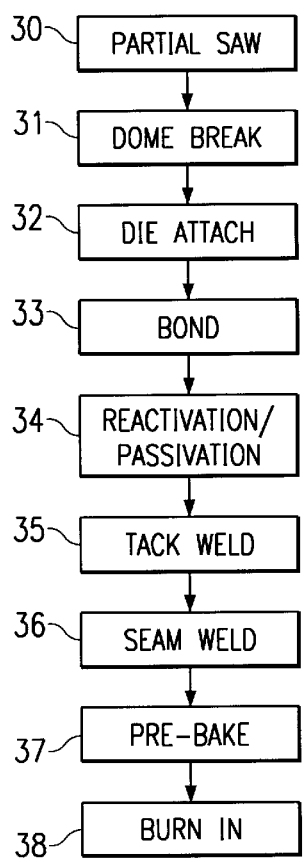
FIG. 3 shows a prior art embodiment of a passivation and packaging process.

An example of a packaging process using a hermetic package with a non-cross linked monolayer is shown in FIG. 3. The process flow shown starts at a point after the micromechanical devices are already manufactured. This can be done with the dies still in wafer form, which is used in this example. However, other types of processing are possible and the use of wafer form processing is not intended as a limitation on the invention described herein.

The dies are partially separated from other dies on the wafer by a partial saw at step 30. In this step, the streets between the die are only partially sawn. In manufacturing micromechanical devices, a complete saw has been found to damage the devices, so a partial saw is performed. After the streets are sawn, the dies are separated completely by a dome break in step 31, in which the wafer is pressed against a dome, causing the wafer to break along the streets.

At steps 32 and 33 the dies are attached and bonded, allowing electrical connection to the micromechanical device on the die. At step 34, the passivant is applied. Prior to applying the passivant, typically by physical vapor deposition, the surfaces to passivated are reactivated. This is done in one of several ways, such as an oxygen plasma clean. It prepares the surfaces to be passivated for reception of the monolayer.

In step 35, the package is tack welded around the device. Once the alignment and positioning is checked, the entire package is seam welded, forming the hermetic seal. In step 37, the device in its package is pre-baked. It has been found that baking the package allows better flow of the passivant, which leads to better device performance. Finally, in step 38 the device is burned in and ready for integration into whatever system will use it.

One type of micromechanical device that uses this type of manufacturing process is the digital micromirror device (DMD™) manufactured by Texas Instruments. The moving parts of the device are an array of minute mirrors deflecting about center hinges. The mirror tips contact landing electrodes. Both surfaces are covered by the passivant, in this case PFDA. This is just one example of a micromechanical device that would benefit from use of the invention described herein.

Figure 4:
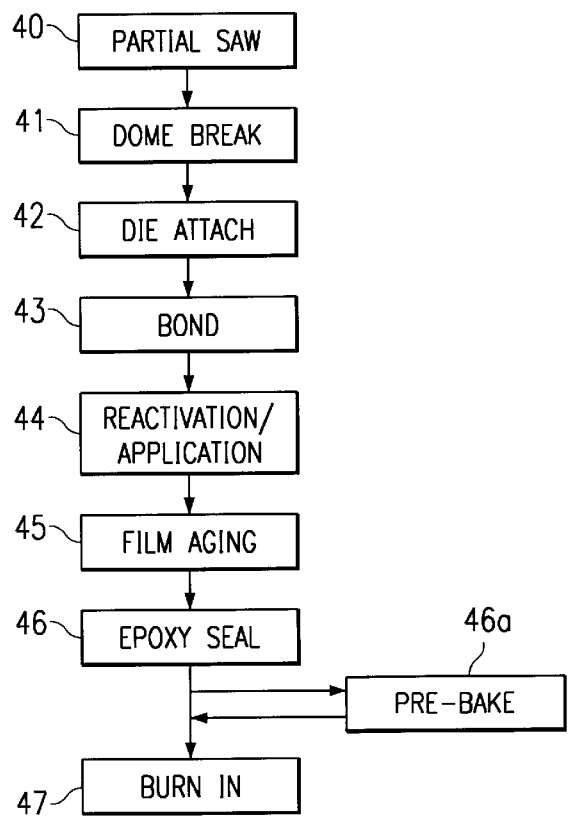
FIG. 4 shows a passivation and packaging process in accordance with the invention.

As mentioned previously, the use of a non-volatile cross-linked layer would alleviate the need for hermetic packaging. A process flow in accordance with this invention is shown in FIG. 4. The process remains the same for the first four steps of the process, steps 40, 41, 42, and 43. Until the next step in the process, all of the example steps could be eliminated. This invention requires only a micromechanical device that requires passivation, regardless of how the micromechanical device is provided.

However, in step 44, the passivation portion of that step is not necessary. A passivating layer may not necessarily result from a passivation process, which can be complicated, such as physical vapor deposition. In this embodiment of the invention, the monolayer just needs to be applied to the device, by one of the methods mentioned above.

Another difference is at step 45. Once the material is applied, the film is aged, allowing formation of the cross-links. At step 46, the device is sealed with an epoxy or other adhesive. This is not a hermetic seal as in the welded seal of the prior art. It may be that the pre-bake step may be beneficial, shown as an optional step 46a. The final step is to burn in the device.

In summary, the passivant used has the capability to cross-link. The passivation process does not require a hermetic seal. This aspect of the invention lead to improved performance at lower cost.

Thus, although there has been described to this point a particular embodiment for a non-volatile passivant for micromechanical devices, it is not intended that such specific references be considered as limitations upon the scope of this invention except in-so-far as set forth in the following claims.

What is claimed is:

1. A micromechanical device, comprising:
    a. a structure with at least one moving element that comes into contact with other surfaces;
    b. a passivation layer on said moving element, said passivation layer comprised of materials with cross-linking capabilities; and
    c. a package containing said structure.

2. The device of claim 1 wherein said structure is a digital micromirror device.

3. A micromechanical device, comprising:
    a. a structure with at least one moving element that comes into contact with other surfaces;
    b. a passivation layer on said moving element, said passivation layer comprised of materials with cross-linking capabilities selected from the group consisting of: vinyl, alkoxylsilyl, ethynyl, diethynyl, and amides; and
    c. a package containing said structure.

4. A micromechanical device, comprising:
    a. a structure with at least one moving element that comes into contact with other surfaces;
    b. a passivation layer on said moving element, wherein said passivation layer is comprised of a material having the formula $CF_3(CF_2)_n(CH_2)_mCOOH$, wherein n is greater than or equal to 7 and m is greater than or equal to 1; and
    c. a package containing said structure.

5. A micromechanical device, comprising:
    a. a structure with at least one moving element that comes into contact with other surfaces;
    b. a passivation layer on said moving element, wherein said passivation layer is comprised of a material having the chemical formula of $CF_3(CF_2)_n(CH_2)_mSi(OR)_3$, wherein n and m are greater than or equal to zero and less than or equal to ten, and R is a straight-chain alkyl; and
    c. a package containing said structure.

6. A micromechanical device, comprising:
    a. a structure with at least one moving element that comes into contact with other surfaces;
    b. a passivation layer on said moving element, wherein said passivation layer is comprised of a material having the chemical formula of $CF_3(CF_2)_m$-linker-$(CH_2)_n$COOH, wherein said linker is a non-branched organic chain; and
    c. a package containing said structure.

7. A method for packaging a micromechanical device, comprising the steps of:
   a. providing a micromechanical device requiring passivation;
   b. cleaning and reactivating at least one surface of said device for passivation;
   c. applying said passivant to said device as a monolayer film;
   d. aging said film to facilitate crosslinking between molecules of said monolayer; and
   e. sealing said package.

8. The method of claim 7 wherein said providing a micromechanical device step further comprises the steps of partially sawing a wafer upon which are digital micromirror devices; breaking said wafer into die; attaching said die; and bonding said die.

9. The method of claim 7 wherein said cleaning step is accomplished with an oxygen plasma clean.

10. The method of claim 7 wherein said application step comprises melt coating.

11. The method of claim 7 wherein said application step comprises vacuum vapor coating.

12. The method of claim 7 wherein said application step comprises coating from solution with a solvent.

13. The method of claim 7 wherein said sealing step produces a non-hermetic seal.

14. The device of claim 3 wherein said structure is a digital micromirror device.

15. The device of claim 4 wherein said structure is a digital micromirror device.

16. The device of claim 5 wherein said structure is a digital micromirror device.

17. The device of claim 6 wherein said structure is a digital micromirror device.

* * * * *